United States Patent [19]

McIntyre

[11] Patent Number: 4,586,066
[45] Date of Patent: Apr. 29, 1986

[54] AVALANCHE PHOTODETECTOR

[75] Inventor: Robert J. McIntyre, Pointe-Claire, Canada

[73] Assignee: RCA Inc., Toronto, Canada

[21] Appl. No.: 650,681

[22] Filed: Sep. 14, 1984

[30] Foreign Application Priority Data

Apr. 10, 1984 [CA] Canada ............................ 451681

[51] Int. Cl.[4] ................... H01L 27/14; H01L 31/00; H01L 29/90
[52] U.S. Cl. ........................... 357/30; 357/13; 357/56
[58] Field of Search .................. 357/30, 13, 16, 61, 357/55, 56

[56] References Cited

U.S. PATENT DOCUMENTS

| | | | |
|---|---|---|---|
| 4,116,733 | 9/1978 | Olsen et al. | 148/175 |
| 4,442,444 | 4/1984 | Osaka | 357/13 |
| 4,471,370 | 9/1984 | Chen et al. | 357/30 |
| 4,473,835 | 9/1984 | Forrest et al. | 357/13 |
| 4,481,523 | 12/1984 | Osaka et al. | 357/13 |

FOREIGN PATENT DOCUMENTS 0043734 7/1981 European Pat. Off. .

OTHER PUBLICATIONS

Nishida et al., Applied Physics Letters 35, 251 (1979).
Olsen et al., Journal of Electronic Materials 9 977 (1980).

Primary Examiner—James W. Davie
Assistant Examiner—Georgia Y. Epps
Attorney, Agent, or Firm—Birgit E. Morris; Donald S. Cohen; William J. Burke

[57] ABSTRACT

The invention relates to an avalanche photodetector having a charge-multiplication region which is spatially separated from the detector surfaces. This photodetector includes an absorptive region, a first region overlying the absorptive region and having a central zone which is thicker than a surrounding peripheral zone and a second region overlying the first region. The avalanche region is then restricted to the thicker central zone of the first region.

5 Claims, 3 Drawing Figures

AVALANCHE PHOTODETECTOR

The Governments of the United States of America and Canada have rights in this invention pursuant to Canadian Sub-Contract No. 14SU70C33-81-R-0122 under Contract No. F19628-82-C-0038 awarded by the United States Department of the Air Force.

The invention relates to an avalanche photodetector having a lower electric field at the P-N junction periphery thereby reducing the surface leakage current and the likelihood of edge breakdown.

BACKGROUND OF THE INVENTION

Optical communication systems which operate in the wavelength range from 1100 to 1700 nanometers (nm) are of potentially great importance because the dispersion and losses in an optical fiber are typically very low in this wavelength range. Heterojunction devices incorporating binary III-V alloys and solid solutions of these alloys have been found to be particularly useful for this application because their electronic bandgaps occur in this wavelength range and lattice-matched heterojunctions can be obtained by compositional variations. In particular, ternary and quaternary alloys of In, Ga, As and P on an InP substrate have found to be useful materials for both light-emitters and detectors.

Problems which have affected the performance of avalanche photodetectors using these materials include bulk tunneling currents which occur at electric fields of the order of $1.5 \times 10^5$ V/cm in the ternary and quaternary compounds used for the light-absorptive region, edge breakdown and multiplication of surface leakage currents at the junction periphery. The tunneling has been reduced by locating the P-N junction with its high electric field in a wide bandgap material separated from the light-absorptive region in the narrower bandgap material. This is the so-called SAM (Separated Absorbing and Multiplying) avalanche photodetector structure.

For a SAM avalanche photodetector comprising a P+-type substrate, an N-type wide bandgap region, an N-type absorptive region and an N+-type cap for contacting purposes, edge breakdown and surface currents are reduced substantially by using sloping sides or surface contouring, thereby forming a mesa structure. This structure has several disadvantages. The region under the contact is multiplying. Illumination through the cap requires that the depletion region extend through the absorptive layer resulting in a high dark current from interface states. With illumination through the substrate the quantum efficiency is reduced by free carrier absorption. For these reasons a mesa structure comprising an N+ substrate, N-type wide bandgap and absorptive regions and an P+-type cap is more desirable. However, the surface contouring then enhances the electric field at the periphery. Thus additional means must be sought to reduce the electric field at the surface so that only avalanche multiplication of photogenerated carriers will occur.

SUMMARY OF THE INVENTION

An avalanche photodetector includes an absorptive region of first conductivity type, a first region of first conductivity type overlying the absorptive region and having a center zone which is thicker than a surrounding peripheral zone and a second region of the opposite conductivity type overlying the first region. Under reverse bias, the peak electric field will be higher in the central zone so that significant multiplication of photogenerated carriers will only occur in that zone.

DETAILED DESCRIPTION OF PREFERRED EMBODIMENTS

Figure 1:
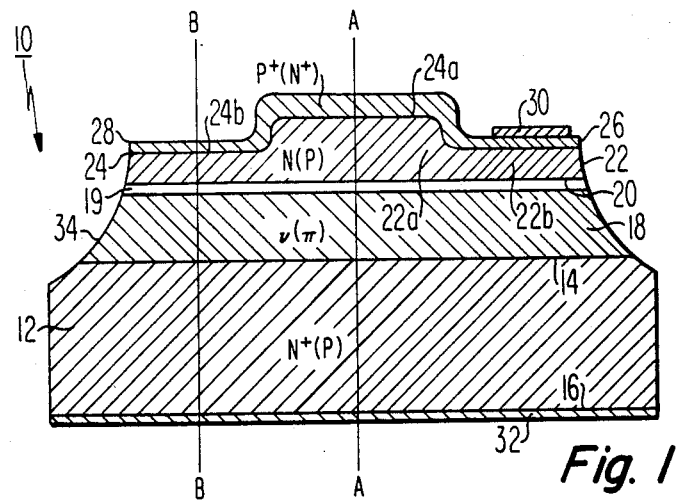
FIGS. 1 and 2 are cross-sectional views of two different embodiments of the avalanche photodetector of the invention.
Figure 2:
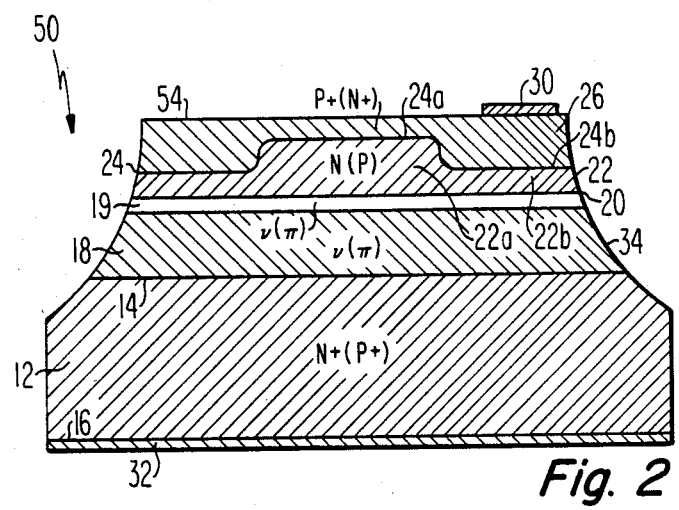

In FIGS. 1 and 2 the numerical identification of the same elements is the same.

The photodetector 10 shown in FIG. 1 includes a substrate 12 having first and second major surfaces 14 and 16, respectively, and a light-absorptive region 18 overlying the first major surface 14. A buffer region 19 having a surface 20 overlies the absorptive region 18. A first region 22 comprising a relatively thicker central zone 22a and a relatively thinner peripheral zone 22b overlies the surface 20. The first region 22 has a surface 24 comprising a central surface area 24a over the central zone 22a and a peripheral surface area 24b over the peripheral zone 22b. A second region 26 having a surface 28 overlies the surface 24. A first electrical contact 30 overlies the surface 28. A second electrical contact 32 overlies the second major surface 16. The photodetector 10 also has a contoured sidewall 34.

The photodetector 50 of FIG. 2 differs from the photodetector 10 in that the second region 26 is thicker over the peripheral zone 22b than over the central portion 22a and has a planar surface 54.

The substrate 12, and the absorptive, buffer and first regions 18, 19, and 22 are of the same conductivity type and the second region 26 is of the opposite conductivity type, producing a P-N junction at the surface 24.

The materials comprising the absorptive, buffer, first and second regions 18, 19, 24 and 26, respectively, are preferably chosen such that their lattice constants are matched to that of the substrate 12 to within about 0.5 percent.

The substrate 12 is composed of a semiconductor material such as N-type InP doped with sulfur to a concentration of about $5 \times 10^{18}/cm^3$. The substrate 12 has sufficient thickness to support the remainder of the structure and is typically between about 0.03 and 0.04 cm thick. The major surface 14 is typically treated with Caro's acid and one percent bromine-in-methanol solution to remove surface contamination and damage prior to the deposition of the layers thereon.

The absorptive region 18 is composed of a material which absorbs light at the wavelength of interest in the range between 1100 and 1700 nm. Suitable materials include $In_{0.53}Ga_{0.47}As$ which absorbs at wavelengths less than 1650 nm and $In_xGa_{1-x}As_yP_{1-y}$ which absorbs light at wavelengths less than a maximum wavelength determined by the choice of x and y as disclosed, for example, by Olsen et al. In the Journal of Electronic Materials 9, 977 (1980). This region is preferably slightly v-type conducting, and is deposited as undoped material typically containing less than about $3 \times 10^{15}$ donors/$cm^3$ and preferably less than $10^{15}$ donors/$cm^3$. The doping level is such that for the voltages typically applied to the photodetector, the electric field is less than about $1.5 \times 10^5$ V/cm. This region is between about 5 and 15 micrometers (μm) thick and preferably between about 8 and 12 μm thick.

The buffer region 19 is composed of a material, typically $In_aGa_{1-a}As_bP_{1-b}$ having a graded or fixed bandgap energy between that of the absorptive and first regions 18 and 24 and is typically about 0.5 μm thick. This region is used to avoid the slow detector response associated with the accumulation of charge carriers near the valenceband discontinuity at the heterojunction but may be omitted.

The first region 22 is typically composed of a semiconductor material, such as N-type InP, having a thickness in its central zone 22a and conductivity modifier concentration sufficient to produce avalanche multiplication of carriers photogenerated in the light-absorptive region 18 when a reverse-bias of sufficient magnitude is applied between the electrical contacts 30 and 32.

The excess areal concentration of conductivity modifiers in the central zone 22a should be between about 2.5 and $4 \times 10^{12}/cm^2$. The thickness $x_c$ of the central zone 22a is between about 0.6 and 4 μm and the conductivity modifier concentration is typically between about 1 and $8 \times 10^{16}/cm^3$. The excess concentration of conductivity modifiers in the first region 22 is typically greater than ten times and preferably greater than twenty times the concentration in the absorptive and buffer regions 18 and 19, respectively. The thickness $x_p$ of the peripheral zone 22b is preferably less than about 0.6 times $x_c$.

The second region 26 is composed of a semiconductor material such as InP containing an excess of about $10^{18}$ acceptors/$cm^3$, typically zinc, and having a thickness between about 1 and 2 μm.

The first electrical contact 30 is composed of a gold-zinc alloy deposited by vacuum evaporation if the second region 26 is P-type. Preferably the first electrical contact 30 is typically configured so that light enters the detector through the portion of the second region 26 over the central zone 22a and is over the peripheral zone 22b so that any carriers injected into the detector from the contact will not be multiplied. The second electrical contact 32 is composed of a gold/tin alloy deposited by vacuum evaporation if the substrate 12 is N-type.

The substrate 12 and the first and second regions 22 and 26 are preferably substantially light-transmissive at the wavelength to be detected.

In the operation of this photodetector a reverse-bias voltage is applied between the electrical contacts causing the depletion region width in the first region to increase. The width of the depletion region in the central zone 22a along the line A—A of FIG. 1 increases with increasing voltage, with the electric field reaching a value of about 4 to $4.5 \times 10^5$ V/cm when the center zone 22a is fully depleted. A further increase in the applied voltage causes the depletion region to extend into the absorptive region 18 where the electric field does not increase beyond about $1.0 \times 10^5$ V/cm before an electric field $E_{MA}$ sufficient for avalanche breakdown is reached in the central zone 22a.

Figure 3:
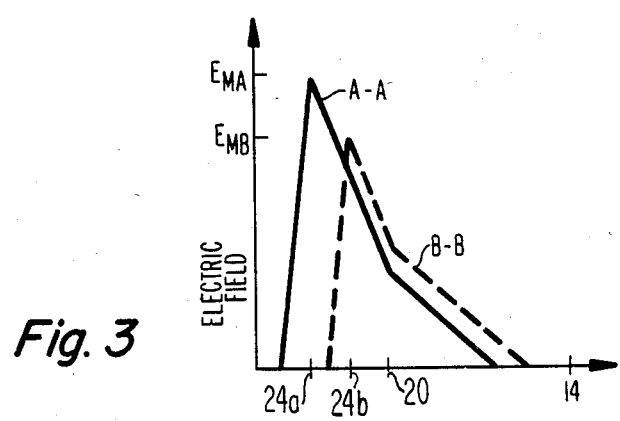
FIG. 3 is a graphical illustration of the electric field distributions along the lines A—A and B—B in the photodetector of FIG. 1.

The electric field is related to the different impurity concentrations and the variations in the thickness of the first region 22. Assuming an abrupt P-N junction and including the buffer region 19 with the absorptive region 18, the peak electric field $E_{MA}$ along the line A—A of FIG. 1, when the depletion region extends into the absorptive region 18, is:

$$E_{MA} = (q/\epsilon)(N_1 x_c + N_2 w_c)$$

where q is the electronic charge, $\epsilon$ is the dielectric constant, $N_1$ is the conductivity modifier concentration in the central zone 22a, $N_2$ is the conductivity modifier concentration and $W_c$ is the depletion region width in the absorptive region 18. The first term represents the field necessary to deplete the central zone 22a. If the electric field for avalanche multiplication is approximately $5 \times 10^5$ V/cm, then this field must be greater than about $3.5 \times 10^5$ V/cm, and less than about $4.7 \times 10^5$ V/cm, and preferably about $4.5 \times 10^5$ V/cm. This electric field distribution is illustrated as a solid curve in FIG. 3 where the numbers on the abscissa correspond to the labels of the surfaces.

The peripheral portion 22b will also fully deplete with the application of the reverse-bias voltage. However, since this portion is thinner, the maximum electric field $E_{MB}$ along the line B—B of FIG. 1 will be less than that in the central zone 22a and also less than the field required for avalanche multiplication. The electric field $E_{MB}$ in the peripheral zone 22b when the depletion region extends into the absorptive region 18 is:

$$E_{MB} = (q/\epsilon)(N_1 x_p + N_2 w_p)$$

where $x_p$ is the thickness of the peripheral zone 22b and $w_p$ is the depletion region depth in the absorptive region 18 at the periphery. Since $X_p < x_c$, $w_p > w_c$, the electric field at the heterojunction on the periphery will be greater than in the center of the detector. This electric field distribution is illustrated as the broken curve in FIG. 3.

The semiconductor regions of the photodetector 10 may be sequentially formed on the substrate surface using liquid-phase or, preferably, vapor-phase epitaxy techniques such as those disclosed by Olsen et al. in U.S. Pat. No. 4,116,733, incorporated herein by reference. A ν-type absorptive layer, a first N-type InP layer and a second P-type InP layer having the desired conductivity modifier concentrations are sequentially deposited on a major surface of an N-type InP wafer using vapor-phase epitaxy techniques. Portions of the surface of the second layer are covered with an $SiO_2$ etch-resistant mask. The surrounding portion of the second layer and a portion of the underlying first layer are removed by chemical etching in a one percent bromine-in-methanol solution. The mask is removed and an additional P-type InP layer is deposited over the second layer and the exposed portions of the first layer. Electrical contacts are deposited on the third layer and defined using photolithographic techniques. Mesas are then etched into the layers and the detectors are separated using conventional techniques. Alternatively the P-type regions can be formed in the exposed surface of the first layer using ion implantation and/or diffusion techniques.

The photodetector 50 may be fabricated by depositing the layers sequentially on a wafer as for the photodetector 10. Portions of the surface are covered with an $SiO_2$ diffusion or ion-implantation mask. The peripheral portions of the second region 26 are then formed by diffusion or ion implantation of additional acceptors followed by a drive-in diffusion or annealng step using standard techniques. The electrical contacts and mesas are then formed and the detectors separated. Using this approach the regrowth step is eliminated.

I claim:

1. An avalanche photodetector comprising:

a substrate of first conductivity type having a first major surface;

a light-absorptive region of first conductivity type overlying said first major surface;

a first region of first conductivity type overlying said absorptive region and having a central zone and a surrounding peripheral zone wherein said central zone is thicker than said peripheral zone;

a second region of opposite conductivity type overlying said first region;

a first electrical contact to said second region; and a second electrical contact to said substrate.

2. The photodetector of claim 1 wherein said areal concentration of conductivity modifiers in the central zone is between about 2.5 and $4 \times 10^{12}/cm^2$.

3. The photodetector of claim 2 wherein said central zone is between about 0.6 and 4 micrometers thick and said peripheral zone is less than about 0.6 times the thickness of said central zone.

4. The photodetector of claim 3 further comprising a buffer region between said absorptive and first regions.

5. The photodetector of claim 3 wherein said first region is composed of N-type InP, said second region is composed of P-type InP and said light-absorptive region has $\nu$-type conductivity and is composed of a material selected from a group consisting of $In_{0.57}Ga_{0.43}As$ and $In_xGa_{1-x}As_yP_{1-y}$ alloys.

* * * * *